United States Patent
Bai et al.

(10) Patent No.: US 12,386,403 B2
(45) Date of Patent: Aug. 12, 2025

(54) SYSTEM AND METHOD FOR THERMAL MANAGEMENT OF COMPUTING DEVICES USING TEMPERATURE MEASUREMENT

(71) Applicant: Dell Products L.P., Round Rock, TX (US)

(72) Inventors: Yuntian Bai, Suzhou (CN); Longfei Xu, Kunshan (CN); Qizhen Lu, Kunshan (CN)

(73) Assignee: Dell Products L.P., Round Rock, TX (US)

( * ) Notice: Subject to any disclaimer, the term of this patent is extended or adjusted under 35 U.S.C. 154(b) by 500 days.

(21) Appl. No.: 17/892,729

(22) Filed: Aug. 22, 2022

(65) Prior Publication Data
US 2024/0012457 A1    Jan. 11, 2024

(51) Int. Cl.
  *G06F 1/20*   (2006.01)
  *H05K 7/20*   (2006.01)
(52) U.S. Cl.
  CPC ......... *G06F 1/206* (2013.01); *H05K 7/20154* (2013.01); *H05K 7/20172* (2013.01); *H05K 7/20209* (2013.01)
(58) Field of Classification Search
  USPC ........................................................ 700/300
  See application file for complete search history.

(56) References Cited

U.S. PATENT DOCUMENTS

| | | | | |
|---|---|---|---|---|
| 4,678,489 A | * | 7/1987 | Bertelsen | B08B 15/02 96/135 |
| 7,621,018 B2 | * | 11/2009 | Libhart | E01H 1/0809 15/340.1 |
| 8,449,173 B1 | * | 5/2013 | Strong | G01M 99/002 374/57 |
| 2013/0125149 A1 | * | 5/2013 | Shimomura | G11B 17/0405 720/601 |
| 2013/0314202 A1 | * | 11/2013 | Bolton | H01L 23/34 337/299 |
| 2014/0163766 A1 | * | 6/2014 | Duron | G06F 9/4893 700/300 |
| 2018/0252593 A1 | * | 9/2018 | Kutty | H05K 7/20836 |
| 2020/0117254 A1 | * | 4/2020 | Lin | G06F 1/28 |
| 2020/0221603 A1 | * | 7/2020 | Shabbir | H05K 7/20727 |
| 2021/0235575 A1 | * | 7/2021 | Wang | H05K 1/181 |
| 2022/0326096 A1 | * | 10/2022 | Kapila | G01K 11/24 |

* cited by examiner

*Primary Examiner* — Hien D Khuu
(74) *Attorney, Agent, or Firm* — WOMBLE BOND DICKINSON (US) LLP

(57) ABSTRACT

Methods and systems for managing the thermal state of a data processing system are disclosed. To manage the thermal state of the data processing system, the thermal dissipation capability of the data processing system may be monitored. The thermal dissipation capability of the data processing system may be compared to a nominal capability to ascertain whether it is likely that material has been deposited within the data processing system. If it is determined that material has likely been deposited within the data processing system, then the data processing system may perform an action set to reduce the likelihood of an undesired thermal event from occurring due to the presence of the deposited material when the magnitude of the reduction in thermal dissipation capability exceeds a threshold. The actions set may reduce the likelihood of the undesired thermal event from occurring.

19 Claims, 8 Drawing Sheets

SYSTEM AND METHOD FOR THERMAL MANAGEMENT OF COMPUTING DEVICES USING TEMPERATURE MEASUREMENT

FIELD OF THE DISCLOSED EMBODIMENTS

Embodiments disclosed herein relate generally to thermal management. More particularly, embodiments disclosed herein relate to systems and methods for managing thermal dissipation through user alerts.

BACKGROUND

Computing devices may perform computations to provide computer implemented services. To perform computations, various hardware components of the computing devices may consume electrical power. Heat may be generated when the electrical power is consumed.

BRIEF DESCRIPTION OF THE DRAWINGS

Embodiments disclosed herein are illustrated by way of example and not limitation in the figures of the accompanying drawings in which like references indicate similar elements.

DETAILED DESCRIPTION

Figure 1A:
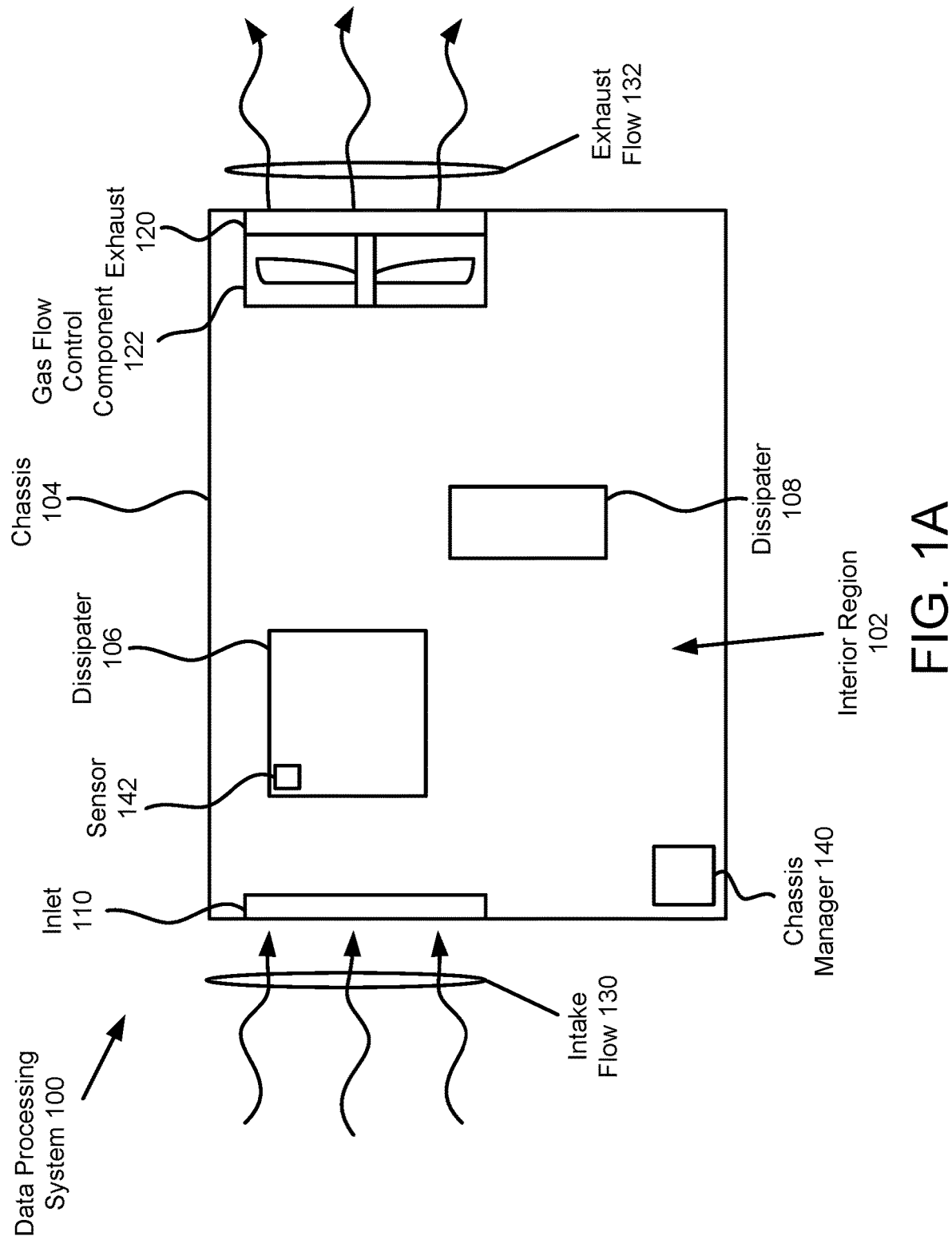
FIG. 1A shows a diagram illustrating a data processing system in accordance with an embodiment.

Various embodiments and aspects disclosed herein will be described with reference to details discussed below, and the accompanying drawings will illustrate the various embodiments. The following description and drawings are illustrative of the embodiments disclosed herein and are not to be construed as limiting the embodiments disclosed herein. Numerous specific details are described to provide a thorough understanding of various embodiments of embodiments disclosed herein. However, in certain instances, well-known or conventional details are not described in order to provide a concise discussion of embodiments disclosed herein.

Reference in the specification to "one embodiment" or "an embodiment" means that a particular feature, structure, or characteristic described in conjunction with the embodiment can be included in at least one embodiment disclosed herein. The appearances of the phrase "in one embodiment" in various places in the specification do not necessarily all refer to the same embodiment.

References to an "operable connection" or "operably connected" means that a particular device is able to communicate with one or more other devices. The devices themselves may be directly connected to one another or may be indirectly connected to one another through any number of intermediary devices, such as in a network topology.

In general, embodiments disclosed herein relate to methods and systems for managing the thermal state of a data processing system. To manage the thermal state of the data processing system, the thermal dissipation capability of the data processing system may be monitored.

The thermal dissipation capability of the data processing system may be compared to a nominal capability to ascertain whether it is likely that material has been deposited within the data processing system. If it is determined that material has likely been deposited within the data processing system, then the data processing system may perform an action set to reduce the likelihood of an undesired thermal event from occurring due to the presence of the deposited material when the magnitude of the reduction in thermal dissipation capability exceeds a threshold. The actions set may reduce the likelihood of the undesired thermal event from occurring.

By doing so, embodiments disclosed here may improve the uptime of computer implemented services by facilitating proactive identification and remediation of material deposits within data processing systems.

In an embodiment, a computer-implemented method for managing a thermal state of a data processing system that provides computer implemented services is provided. The method may include identifying a thermal management event for the data processing system; based on the identified thermal management event, initiating performance of a thermal test plan; while the thermal test plan is performed, monitoring thermal states of one or more thermally active components of the data processing system to obtain a thermal test plan result, the thermal test plan result indicating a rate of thermal dissipation for the one or more thermally active components; obtaining a thermal performance metric based on the thermal test plan result; making a determination that the thermal performance metric indicates that an undesirable thermal event is likely to occur, an instance of the undesirable thermal event preventing the computer implemented services from being provided, at least temporarily, by the data processing system; and based on the determination, performing an action set to reduce a likelihood of the undesired thermal event from occurring.

The thermal test plan result indicates a temperature increase rate of at least one of the one or more thermally active components.

Initiating the thermal test plan may include identifying a thermal generation rate specified by the thermal test plan; and setting an operation of the at least one of the one or more thermally active components to generate heat at the thermal generate rate.

Initiating the thermal test plan may also include identifying a thermal dissipation rate specified by the thermal test plan; and setting an operation of a thermal dissipation component to dissipate the heat at the thermal dissipation rate.

The thermal dissipation components may include a fan and operation of the fan is set to generate a gas flow that dissipates the heat, and the operation of the fan set based, at least in part, on an assumption that a dissipater for the at least one of the one or more thermally active components is substantially free of insulating material.

The operation of the fan may be further set, based at least in part, on an assumption that a constriction in a flow path of the gas flow is substantially free of constricting material.

The operation of the fan may be set to a predetermined operating point for a period of time during the performance of the thermal test plan.

The thermal performance metric may be obtained, at least in part, by quantifying a difference between the temperature increase rate of the at least one of the one or more thermally active components and an expected temperature increase rate of the at least one of the one or more thermally active components.

Initiating the thermal test plan may include initiating passive temperature monitoring to obtain a first result; and initiating passive thermal load generation monitoring to obtain a second result.

The thermal performance metric may be obtained, at least in part, by quantifying a difference between: a temperature increase rate of the at least one of the one or more thermally active components obtained via the passive temperature monitoring; and a temperature increase rate of the at least one of the one or more thermally active components obtained via previously performed passive temperature monitoring.

The action set may include displaying an alert to a user of the data processing system, the alert indicating that a cleaning procedure should be performed, and the cleaning procedure removing material from an interior of the data processing system that may reduce the rate at which heat may be dissipated from the at least one of the one or more thermally active components.

The determination may be made by comparing the thermal performance metric to a second thermal performance metric associated with the data processing system when substantially free from the material.

A non-transitory media may include instructions that when executed by a processor cause the computer-implemented method to be performed.

A data processing system may include the non-transitory media and a processor, and may perform the computer-implemented method when the computer instructions are executed by the processor.

Turning to FIG. 1A, a diagram illustrating an interior region 102 of a data processing system 100 in accordance with an embodiment is shown. The interior region 102 may be a portion of an interior of a chassis 104 or other structure in which various hardware components may be positioned. For example, data processing system 100 may include be a laptop computer and interior region 102 may be an interior portion of chassis 104 of the laptop in which various hardware components (not shown) such as processors, memory modules, storage devices, and/or other components may be positioned.

The hardware components may facilitate performance of workloads (e.g., computer-implemented services performed by executing computing instructions with at least one processor of one or more data processing systems). The workloads may provide computer implemented services to users of the data processing system and/or other computing devices operably connected to data processing system 100. The computer implemented services may include any type and quantity of services including, for example, database services, instant messaging services, video conferencing services, etc. Different data processing systems may provide similar and/or different computer implemented services.

To provide the computer implemented services, the hardware components within interior region 102 may consume electricity and generate heat as a byproduct. All or a portion of the hardware components may have corresponding thermal ranges in which they are operational. If the heat generated by consumption of electricity raises a temperature of one of the hardware components outside of its operating range, then the hardware components may malfunction or cause other types of undesired actions to occur. Additionally, even if the temperature of the hardware components does not exceed its operating range, elevated temperature of the hardware component may reduce its working life, increase its risk of unexpected failure, or otherwise cause undesired impacts on the operation of data processing system 100.

To manage the temperature of the hardware devices, various dissipation components (e.g., 106, 108) may be positioned with the hardware components. The dissipation components may include heatsinks, heat spreaders, active components such as fans, etc. These dissipation components may dissipate heat from the hardware components into the environment surrounding the dissipation components.

The rate of dissipation of the heat from the hardware components may be modified by reducing the temperature of the ambient environment and causing gases to flow proximate to the dissipation components. To manage the temperature of the ambient environment and to cause gases to flow proximate to the dissipation components, data processing system 100 may include one or more inlet 110 and exhaust 120. Inlet 110 and exhaust 120 may include openings in chassis 104 that allow gases to be exhausted from and drawn into interior region 102. In this manner, warmed gasses may be expelled from interior region 102 and cool gasses may be drawn into interior region 102.

To manage the rate of gas flow into and/or out of interior region 102, data processing system 100 may include one or more of gas flow control component 122. Gas flow control component 122 may (i) generate flows of gasses and (ii) be positioned to direct the flow of the gas within chassis 104 (e.g., into our out of inlet 110 or exhaust 120, in FIG. 1A it is shown positioned with exhaust 120 to generate a gas flow out of exhaust into 120. When one or more of gas flow control component 122 are operated, intake flow 130 and/or exhaust flow 132 may be established to drive gas exchange between interior region 102 and an ambient environment.

While the flow of gas may facilitate dissipation of heat generated by the hardware components, the flow of gas into interior region 102 may cause dust, debris, and/or other materials (e.g., in aggregate the "entrained materials") from the ambient environment to flow into interior region 102. When inside of interior region 102, the trained materials may settle or otherwise deposit themselves onto various components within interior region.

For example, some of the entrained materials may be deposited onto one of dissipater 106 and dissipater 108. The deposited materials may form a layer on an exterior of dissipater 106. The layer may insulate these dissipation components thereby reducing the rate at which heat from the hardware components positioned therewith may be dissipated.

In another example, some of the entrained materials may be deposited onto inlet 110 and/or exhaust 120. The deposited materials may reduce a size of an opening through which gasses may flow thereby increasing the impedance to the flow of gasses. If gas flow control component 120 has a limited rate at which it may accelerate gasses, the reduction in the size of the opening may reduce the maximum rate of the flow of gasses into and out of interior region 102, as well as throughout interior region 102, which may be established by gas flow control component 122.

In general embodiments disclosed herein relate to methods, systems, and devices for managing the thermal state of data processing systems. To manage the thermal states of data processing systems, data processing system 100 may (i) identify the rate at which it is able to dissipate heat from one or more of its hardware components when operating nominally (e.g., dissipation components are free of material layers that may insulate them, inlet 110/exhaust 120 are not constricted with deposited materials, etc.), (ii) monitor the rate at which it is able to dissipate heat from one or more of its hardware components over time, and (iii) take action when changes in the dissipation rate indicate that various hardware components may be impair due to deposited material layers to remediate potential thermal events prior to their occurrence.

To provide the aforementioned functionality, data processing system 100 may include chassis manager 140 and one or more of sensor 142. Chassis manager 140 may monitor for and response to identified changes in thermal dissipation rates for various hardware components. To do so, chassis manager 140 may obtain measurements from sensor 142 which may report, for example, a temperature of a hardware components or location within chassis 104 (which may correspond to a hardware component for indirect temperature measurement), a flow rate of gas, and/or other characteristics of the environment of data processing system 100.

Sensor 142 may be implemented with a physical sensor (discrete or integrated into another component, such as a temperature sensor of a processor) such as a thermocouple to measure temperature, a flow meter to measure a gas flow rate, or any other type of sensor to measure various quantities. While illustrated in FIG. 1A with respect to a single sensor, any number of sensor 142 may be positioned throughout chassis 104 to measure temperatures of any number of components or positions within chassis 104, gas flow rates at various locations, and/or other quantities. Sensor 142 may be operably connected to chassis manager 140 through any number and type of wired or wireless communication mediums (e.g., networks, wired point to point connections, a wireless network, etc.).

To monitor for changes in thermal dissipation rates, chassis manager 140 may cooperate with operating systems or other management entities hosted by the hardware components. The chassis manager 140 may cooperate with these management entities to place the hardware components into predetermined operating modes to cause the hardware components to generate heat at predetermined rates over predetermined periods of time (e.g., during measurement periods). During these times, chassis manager 140 may monitor the measurements provided by sensor 142 to establish time-measurement relationships.

Chassis manager 140 may compare these relationships to similar relationships established when data processing system 100 is known to operate nominally. Differences between these relationships may indicate that various components (e.g., dissipation components, gas flow components, inlets/exhaust) have been impacted by entrained materials. When such a determination is made, chassis manager 140 may initiate performance of an action set to reduce the impact on these components. The action set may cause deposited entrained material layers to be removed thereby improving the rate at which heat may be dissipated from the hardware components. Doing so may reduce the likelihood of thermal events from occurring. A thermal event may be an occurrence of a temperature of a hardware component exceeding its operating range, or nominal operating range. The occurrence of such an event negatively impact the operation of data processing system by 100, for example, causing computations to be improperly performed, causing the hardware components to restart, etc.

Figure 4:
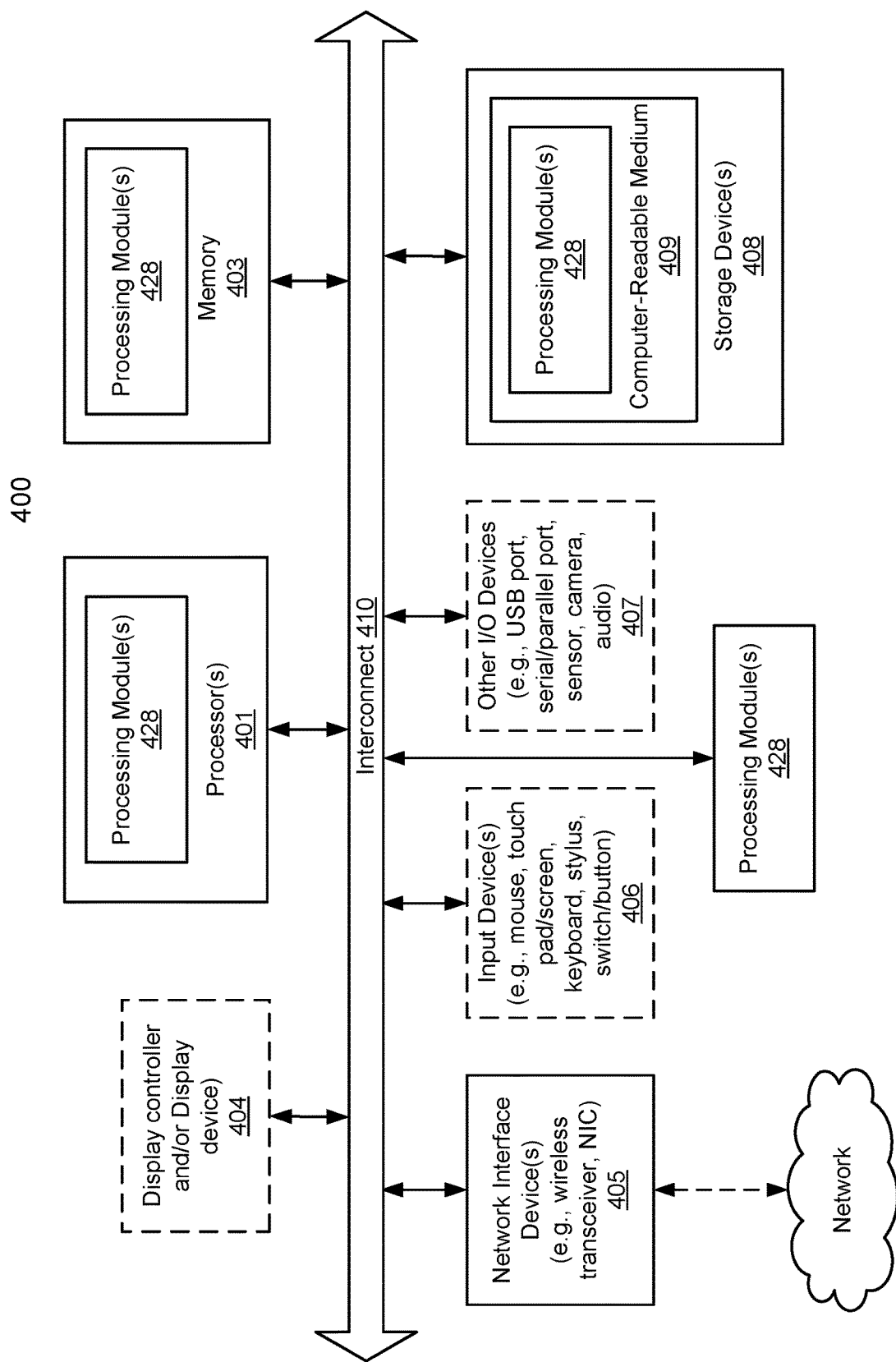
FIG. 4 shows a block diagram illustrating a data processing system in accordance with an embodiment.

The hardware components positioned in chassis 104 may, at least in part, form a computing device. Refer to FIG. 4 for additional details regarding computing devices.

Chassis manager 140 may be implemented with hardware devices and/or software components hosted by the hardware devices. In an embodiment, Chassis manager 140 is implemented using a hardware device including circuitry. The hardware device may be, for example, a digital signal processor, a field programmable gate array, system on a chip, or an application specific integrated circuit. The circuitry may be adapted to cause the hardware device to perform the functionality of chassis manager 140. chassis manager 140 may be implemented using other types of hardware devices without departing embodiments disclosed herein.

In an embodiment, chassis manager 140 is implemented using a processor adapted to execute computing code stored on a persistent storage that when executed by the processor performs the functionality of chassis manager 140 discussed throughout this application. The processor may be a hardware processor including circuitry such as, for example, a central processing unit, a processing core, a part of a system on a chip or other type of special purpose hardware device, a management controller, and/or a microcontroller. The processor may be other types of hardware devices for processing information without departing embodiments disclosed herein.

Generally, chassis manager 140 may include functionality to communicate with other hardware components and software components hosted thereby. Chassis manager 140 may do so using any communication protocol.

To facilitate these communication, a communication bus (not shown) may be implemented between chassis manager 140, sensor 142, gas flow control component 122 (or controller thereof), any of the hardware components (or intermediaries) cooled by dissipation devices, and/or other devices (e.g., external to or a part of data processing system 100). The communications bus may support various communications standards.

Figure 1B:
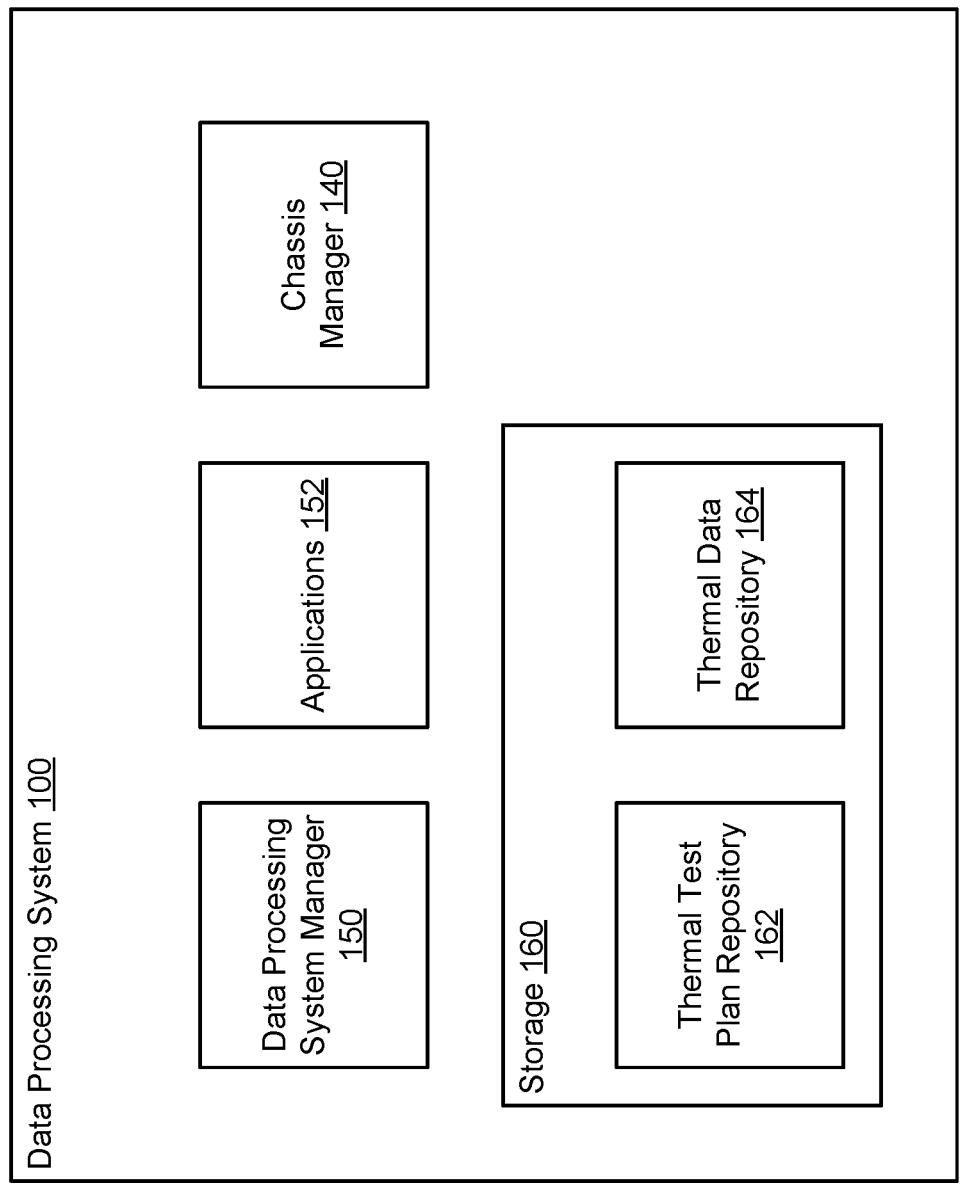
FIG. 1B shows a block diagram illustrating a data processing system in accordance with an embodiment.

Refer to FIG. 1B for additional details regarding chassis manager 140.

Data processing system 100 may be implemented with a computing device such as a host or server, a personal computer (e.g., desktops, laptops, and tablets), a "thin" client, a personal digital assistant (PDA), a Web enabled appliance, embedded computing device such as a system on a chip, a mobile phone (e.g., Smartphone), and/or any other type of computing device or system. For additional details regarding computing devices, refer to FIG. 4.

While illustrated in FIG. 1A as including a limited number of specific components, a data processing system in accordance with an embodiment may include fewer, additional, and/or different components than those illustrated therein.

Turning to FIG. 1B, a block diagram of data processing system 100 in accordance with an embodiment is shown. As discussed above, data processing system 100 may manage the thermal states of its components by monitoring for and initiating remediation changes in the heat dissipation capability of its components. To provide its functionality, data processing system 100 may include data processing system manager 150, applications 152, chassis manager 140 (discussed with respect to FIG. 1A), and storage 160. Each of these components is discussed below.

Data processing system manager 150 may manage the operation of data processing system 100. For example, data processing system manager 150 may (i) manage use of hardware components by applications 152, (ii) cooperate with chassis manager 140 to implement thermal test plans to identify heat dissipation capabilities for the hardware components, and/or (iii) provide other services to manage the operation of data processing system 100. Data processing system manager 150 may be implemented with, for example, a startup manager such as a basic input output system, an operating system that manages the operation of data processing system 100 after startups are completed, various drivers or other entities that facilitate use of the hardware components, and/or other types of entities.

Applications 152 may provide, at least in part, the computer implemented services provided by data processing system 100. Applications 152 may provide any number and type of computer implemented services individually and/or in cooperation with other entities (local or remote to data processing system 100).

Chassis manager 140, as discussed with respect to FIG. 1A, may provide thermal management services for data processing system 100. The thermal management services may include (i) managing the operation of components (e.g., gas flow control component 122, other types of airflow control/generation components) used to thermally manage all, or a portion, of the hardware components of data processing system 100, (ii) monitoring the heat dissipation capabilities available to cool the hardware components, and (iii) initiating remediation of the heat dissipation capabilities based on the monitoring (e.g., in response to the monitoring indicating that the heat dissipation capabilities have been compromised to a predetermined degree).

To monitor the heat dissipation capabilities available to cool the hardware components, chassis manager 140 may utilize thermal test plans stored in thermal test plan repository 162. As will be discussed below, these thermal test plans, when performed, may allow for changes in heat dissipation capabilities to be identified, and provide for potential responses to such changes.

In an embodiment, one or more of data processing system manager 150, applications 152, and chassis manager 140 is implemented using a hardware device including circuitry. The hardware device may be, for example, a digital signal processor, a field programmable gate array, or an application specific integrated circuit. The circuitry may be adapted to cause the hardware device to perform the functionality of data processing system manager 150, applications 152, and/or chassis manager 140. Data processing system manager 150, applications 152, and/or chassis manager 140 may be implemented using other types of hardware devices without departing embodiment disclosed herein.

In one embodiment, one or more of data processing system manager 150, applications 152, and chassis manager 140 is implemented using a processor adapted to execute computing code stored on a persistent storage that when executed by the processor performs the functionality of data processing system manager 150, applications 152, and/or chassis manager 140. discussed throughout this application. The processor may be a hardware processor including circuitry such as, for example, a central processing unit, a processing core, or a microcontroller. The processor may be other types of hardware devices for processing information without departing embodiment disclosed herein.

Figure 2A:
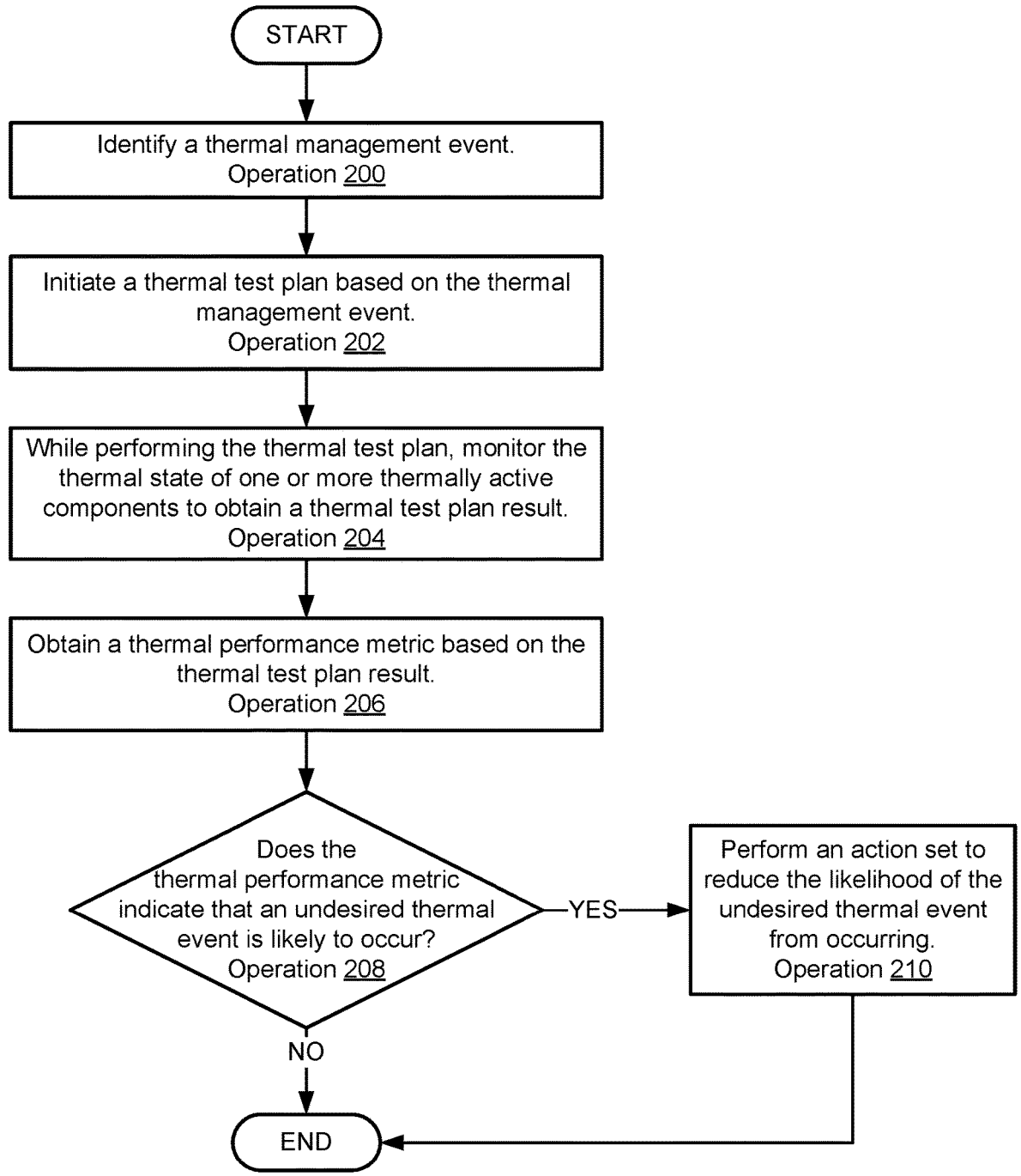
FIG. 2A shows a flow diagram illustrating a method of responding to a thermal management event in accordance with an embodiment.
Figure 2B:
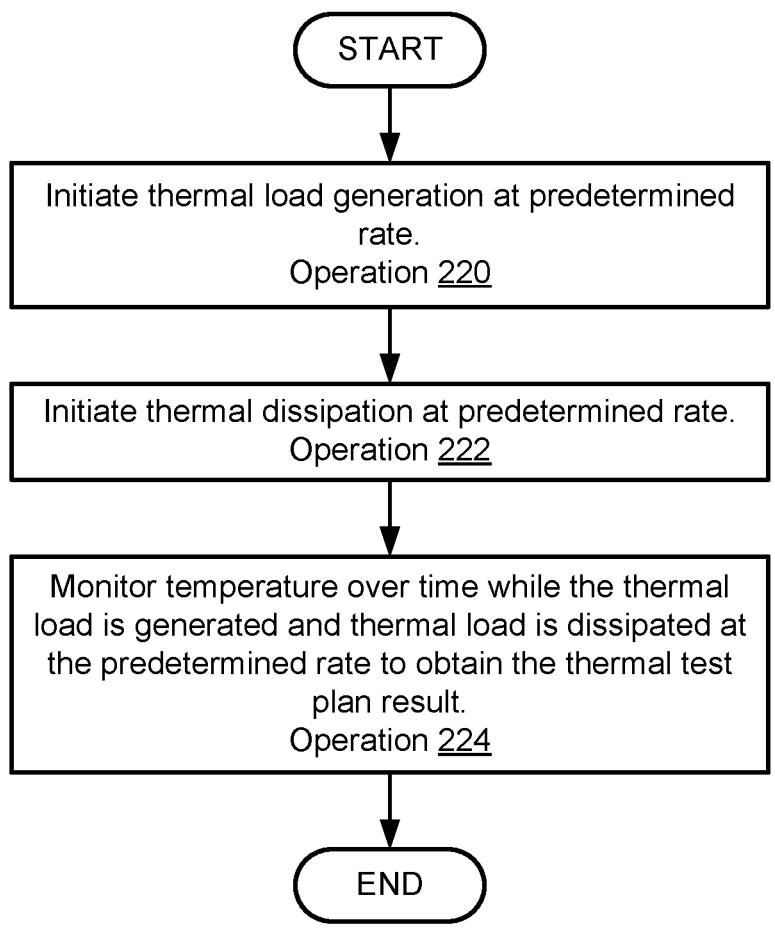
FIG. 2B shows a flow diagram illustrating a method of performing a first thermal test plan in accordance with an embodiment.
Figure 2C:
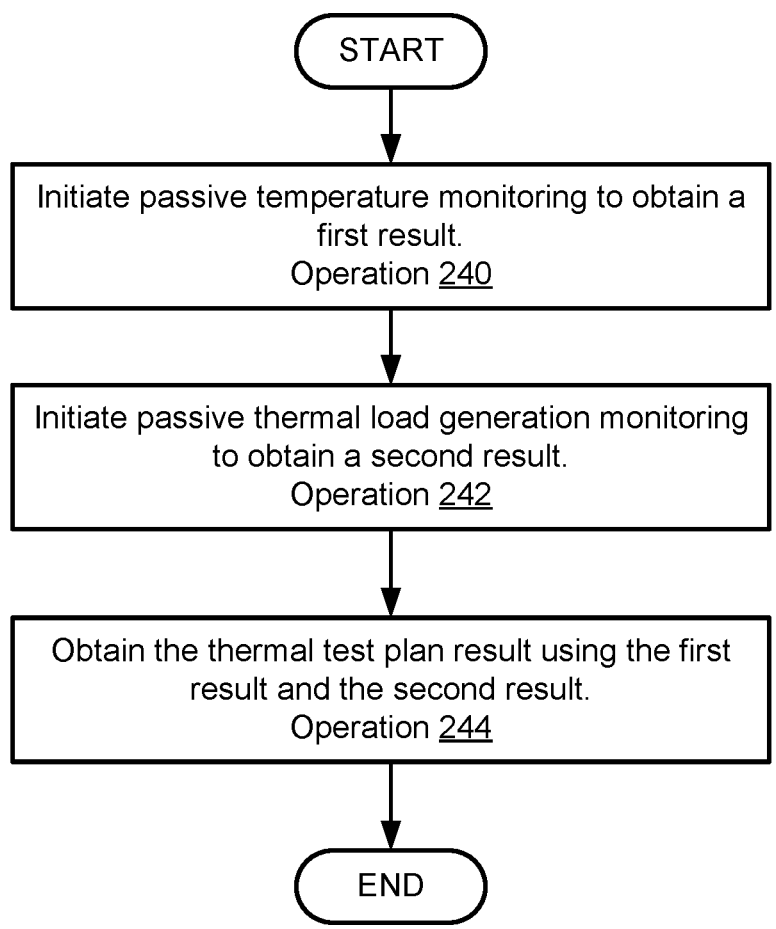
FIG. 2C shows a flow diagram illustrating a method of performing a second thermal test plan in accordance with an embodiment.

While providing their functionalities, any of data processing system manager 150, applications 152, and/or chassis manager 140 may perform all, or a portion, of the methods illustrated in FIGS. 2A-2C.

In an embodiment, storage 160 is implemented using physical devices that provide data storage services (e.g., storing data and providing copies of previously stored data). The devices that provide data storage services may include hardware devices and/or logical devices. For example, storage 160 may include any quantity and/or combination of memory devices (i.e., volatile storage), long term storage devices (i.e., persistent storage), other types of hardware devices that may provide short term and/or long term data storage services, and/or logical storage devices (e.g., virtual persistent storage/virtual volatile storage).

For example, storage 160 may include a memory device (e.g., a dual in line memory device) in which data is stored and from which copies of previously stored data are provided. In another example, storage 160 may include a persistent storage device (e.g., a solid-state disk drive) in which data is stored and from which copies of previously stored data is provided. In a still further example, storage 160 may include (i) a memory device (e.g., a dual in line memory device) in which data is stored and from which copies of previously stored data are provided and (ii) a persistent storage device that stores a copy of the data stored in the memory device (e.g., to provide a copy of the data in the event that power loss or other issues with the memory device that may impact its ability to maintain the copy of the data cause the memory device to lose the data).

Storage 160 may also be implemented using logical storage. A logical storage (e.g., virtual disk) may be implemented using one or more physical storage devices whose storage resources (all, or a portion) are allocated for use using a software layer. Thus, a logical storage may include both physical storage devices and an entity executing on a processor or other hardware device that allocates the storage resources of the physical storage devices.

In an embodiment, storage 160 represents the storage resources of various hardware components of data processing system 100, and the storage resources of chassis manager 140 (which may include storage separate from the other data storage components of data processing system 100). For example, chassis manager 140 may be implemented as a management controller that operates as a separate computing device positioned within data processing system 100 and may be operably connection to all or a portion of the other hardware components of data processing system 100. Thus, all or a portion, of the data structures illustrated as being stored in storage 160 may be stored in storage resources of hardware components of data processing system 100, in storage resources of chassis manager 140, and/or in storage resources of both the hardware components of data processing system 100 and chassis manager 140 (e.g., when data is replicated between these two sets of storage resources).

Storage 160 may store data structures including thermal test plan repository 162 and thermal data repository 164. Each of these data structures is discussed below.

Thermal test plan repository 162 may be implemented with one or more data structures that include information regarding thermal test plans that may be performed by data processing system 100. The test plan may include any number and types of actions to be performed over a period of time.

In an embodiment, the actions include one or more of: (i) setting the operation of hardware components to various operating points to cause heat to be generated by the hardware components at corresponding rates, (ii) setting the operation of dissipation components to various operating points to cause gas flows to be generated at corresponding rates, and/or (iii) measuring the temperature of the hardware components at various times during performance of the test plan. For example, the actions may include setting the operation of a processor to perform a predetermined workload that causes heat to be generated by the processor at a predetermined rate, setting an operating point of a fan to a maximum operating point, and sampling the temperature of the processor for a predetermined period of time. The aforementioned actions may result in the generation of a processor temperature over a period of time relationship. The actions may also include calculating various metrics based on this relationship (e.g., the rate of temperature increase at various points in time). Any number of metrics reflecting any type of information derived from the measurements obtained during performance of the thermal test plan may be generated. As will be discussed in greater detail below, these metrics may be compared to thresholds or other conditions which may trigger performance of various actions.

In an embodiment, the actions include one or more of: (i) passively measuring the temperature of one or more hardware components over time, (ii) passively measuring the heat generation rate of the hardware components over time, and/or (iii) passively measuring the operating points of the dissipation components over time. The aforementioned actions may result in the generation of one or more relationships: (i) a hardware component temperature over a period of time relationship, (ii) a heat generation rate of the hardware component over time relationship, and/or (iii) a dissipation component operating point over time relationship. The actions may also include calculating various metrics based on one or more of these relationships (e.g., the rate of temperature increase at various points in time). Any number of metrics reflecting any type of information derived from these relationships obtained during performance of the thermal test plan may be generated. As will be discussed in greater detail below, these metrics may be compared to thresholds or other conditions which may trigger performance of various actions.

The actions may also include one or more actions linked to the metrics. For example, the actions may include conditional actions that are performed when the obtained metrics meet thresholds or other types of criteria. The conditional actions may include, when a corresponding condition is met: (i) notifying a user of the data processing system that the heat dissipation capabilities of the data processing system have been impacted, (ii) notifying the user of actions that that may be performed to remediate the impact on the data processing system, (iii) performing one or more automated actions to attempt to remediate the impact (e.g., generating gas flows designed to dislodge or remove various materials that may be deposited on to dissipation components, gas flow control components, etc.), (iv) storing logs regarding the metrics and/or corresponding estimations regarding how the heat dissipation capabilities of the data processing system have been impacted, (v) notifying administrator or other persons regarding the heat dissipation impact (e.g., via sending electronic communications or emails), and/or (vi) other types of actions that may be used to remediate or initiation remediation of diminished heat dissipation capabilities.

Thermal data repository 164 may be implemented with one or more data structures that include information regarding (i) the results (e.g., profiles) of thermal tests when the heat dissipation capabilities of data processing system 100 are unknown, (ii) the results (e.g., profiles) of thermal test when the heat dissipation capabilities of data processing system 100 are known (e.g., in a known good condition), and/or (iii) thresholds usable to ascertain whether the heat dissipation capabilities of data processing system 100 are nominal.

For example, thermal data repository 164 may include lists implemented with one or more thresholds that if met indicate that the heat dissipation capabilities of data processing system 100 are nominal (e.g., corresponding to the known good condition, or within a variance such that it is unlikely that the diminished heat dissipation capabilities are unlikely to cause negative impacts to data processing system 100). The thresholds may correspond to different types of thermal tests.

In another example, thermal data repository 164 may include measurements similar to those that are obtained by performing the thermal tests. Statistical characterizations of the measurements may additionally or alternatively included in the repository.

Refer to FIGS. 3A-3D for additional information regarding information that may be included in thermal data repository 164.

While various data structures have been illustrated and described in FIG. 1B with specific structures, any of the data structures may be implemented with different structures (e.g., lists, tables, linked lists, databases, etc.), stored in different locations, and/or spanned across any number of devices without departing from embodiments disclosed herein.

While illustrated in FIG. 1B with a limited number of specific components, a data processing system may include additional, fewer, and/or different components without departing from embodiments disclosed herein.

As discussed above, the components of FIGS. 1A-1B may perform various methods to manage heat to improve the likelihood of computer implemented services being provided by data processing systems. FIGS. 2A-2C illustrate examples of methods that may be performed by the components of FIGS. 1A-1B when providing their functionalities. In the diagrams discussed below and shown in FIGS. 2A-2C, any of the operations may be repeated, performed in different orders, and/or performed in a parallel with other operations and/or a partially overlapping in time manner with other operations.

Turning to FIG. 2A, a flow diagram illustrating a method of responding to thermal events in accordance with an embodiment is shown. The method may be performed by a data processing system.

At operation 200, a thermal management event is identified. The thermal management event may be identified by monitoring the operation of a data processing system. The monitoring may indicate, for example, that a condition has occurred. The condition may be, for example, an elapsed duration of time (e.g., to facilitate periodic checking of the data processing system), a powering on of the data processing system (e.g., to facilitate continuous passive monitoring of the data processing system, receiving of input from a user requesting that a thermal check for the data processing system be performed, and/or other types of conditions.

At operation 202, a thermal test plan based on the thermal management event is initiated. The thermal test plan may be initiated by a chassis manager. For example, the chassis manager may communicate with the data processing system manager of the data processing system to orchestrate performance of an active thermal test in which hardware components are operated to generate heat at predetermined rates while their temperatures are monitored or a passive thermal test in which the temperature of hardware components are monitored passively as they operate normally to provide computer implemented services. The chassis manager may also communicate with other devices, such as fans or other components that may manage heat dissipation, to set their operating points during performance of the thermal test plan.

At operation 204, the thermal state of one or more thermally active components are monitored to obtain a thermal test plan result. The thermally active components may be monitored while the thermal test plan is performed. The thermally active components may be monitored by reading temperatures (e.g., using discrete or integrated temperature sensors) of the thermally active components during the thermal test plan performance to obtain a temperature versus time relationships for any of the thermally active components. The thermally active components may include processors, memory modules, storage devices, and/or any other type of hardware component used by a data processing system to provide computer implemented services and for which thermal test plan results are available while the heat dissipation capabilities of the data processing system are known to be in a good state. While described with respect to temperature, other quantities may be measured to establish other relationships between quantities and time (e.g., heat generation of the thermally active components, fan operating points, etc.).

At operation 206, a thermal performance metric based on the thermal test plan result is obtained. The thermal performance metric may be obtained by, for example, calculating a rate at which the temperature of a component increased during the thermal test plan performance. Other metrics may be calculated without departing from embodiments disclosed herein.

At operation 208, a determination is made regarding whether the thermal performance metric indicates that an undesired thermal event is likely to occur. The determination may be made by comparing the thermal performance metric to a threshold or other type of criteria. For example, the threshold may be the rate at which the temperature of the component is expected to change during performance of the thermal test plan while the heat dissipation capabilities of the data processing system are in a known condition. If the thermal performance metric exceeds the threshold, then it may be determined that an undesired thermal event is likely to occur.

In an embodiment, the threshold is larger than the rate at which the temperature of the component is expected to change during performance of the thermal test plan while the heat dissipation capabilities of the data processing system are in a known condition by a factor, such as 10%, 20%, or some amount that unlikely to result in the data processing system being subject to an undesired thermal event. The factor may depend on the type of the component and its characteristics. For example, if the rate is 10° Celsius per minute, then the threshold may be set to 12° Celsius per minute using a factor of 20%.

If it is determined that the thermal performance metric indicates that the undesired thermal event is likely to occur, then the method may proceed to operation 210. Otherwise, the method may end following operation 208. Proceeding to operation 210 may indicate that the data processing system believes that material may be deposited on hardware components that is impairing the heat dissipation capability of the data processing system.

The undesired thermal event may be any type of event that impacts the operation of data processing system due to a temperature of a hardware component such as, for example, the hardware component malfunctioning.

At operation 210, an action set to reduce the likelihood of the undesired thermal event from occurring is performed. The actions set may include any number and type of actions. The actions may include notifying of users that a procedure is to be performed. The procedure may be a cleaning procedure to remove material from one or more components of the data processing system. As discussed above, entrained materials may be deposited onto hardware components of the data processing system as part of its normal operation, which may impair the heat dissipation capability of the data processing system.

The method may end following operation 210.

As discussed above, various thermal test plans may be performed to ascertain whether the data processing system is likely to be subject to an undesired thermal event. FIGS. 2B-2C show methods that may be performed to perform thermal testing as part of the thermal test plans.

Turning to FIG. 2B, a flow diagram illustrating a method of performing an active thermal test in accordance with an embodiment is shown. The method may be performed by a data processing system.

At operation 220, thermal load generation at a predetermined rate is initiated. The thermal load generation may be initiated by a chassis manager and may be generated by a hardware component. The chassis manager may initiate the thermal load generation by sending instructions to a management entity of the data processing system. For example, the chassis manager may be operably connected to a processor of the data processor system. The chassis manager may send a request for performance of a workload to an operating system, or agent hosted thereof, via the operable connection. Depending on the software stack hosted by the data processing system, various drivers or other intermediate management layers between the bare metal processor and operating system may convey the request and subsequent communications between the management entity (e.g., operating system, agent, etc.) and the chassis manager.

At operation 222, thermal dissipation at a predetermined rate is initiated. The thermal dissipation may be for the hardware component, and may be initiated by the chassis manager. For example, the chassis manager may set an operating point of a fan or other dissipation device corresponding to the thermal dissipation rate. The resulting flow of gas may, under nominal conditions, cause thermal dissipation at the thermal dissipation rate. However, if material has been deposited in the data processing system, the material may reduce the thermal dissipation rate thereby causing heat to be more slowly dissipated form the hardware component causing the temperature of the hardware component to increase more quickly.

At operation 224, the temperature of the hardware component is monitored over time while the thermal load is dissipated at the predetermined rate to obtain the thermal test plan result. The temperature may be monitored by reading a sensor (discrete or integrated) that measures the temperature of the hardware component.

The method may end following operation 224.

Turning to FIG. 2C, a flow diagram illustrating a method of performing a passive thermal test in accordance with an embodiment is shown. The method may be performed by a data processing system.

At operation 240, passive temperature monitoring of a hardware component is initiated to obtain a first result. The passive temperature monitoring may be performed for a period of time (e.g., a day, a week, etc.), and the result may be a temperature of the hardware component over time. The passive temperature monitoring may be performed by reading a sensor (discrete or integrated) that measures the temperature of the hardware component.

At operation 242, passive thermal load generation monitoring of the hardware component is initiated to obtain a second result. The passive thermal load generation monitoring may be performed for a period of time (e.g., a day, a week, etc.) corresponding to the first result, and the second result may be a thermal load generation of the hardware component over time.

At operation 244, the thermal test plan result is obtained using the first result, the second result, and/or other data. For example, results may be combined to establish multiple relationships over a period of time that the thermal test is performed.

The method may end following operation 244.

As noted above, temperature measurements of hardware components during thermal testing may be obtained and used to: (i) determine whether the heat dissipation for the component is nominal, and (ii) determine the likelihood of a thermal event occurring. Information from these measurements may be compared to information from similar test performed for similar data processing systems while in known conditions (e.g., free of material deposits). FIGS. 3A-3D show plots of temperature profiles of hardware components during various thermal tests. In each of these figures, the horizontal axis indicates time from the start of a thermal test and the vertical axis indicates a temperature of a hardware component.

Figure 3A:
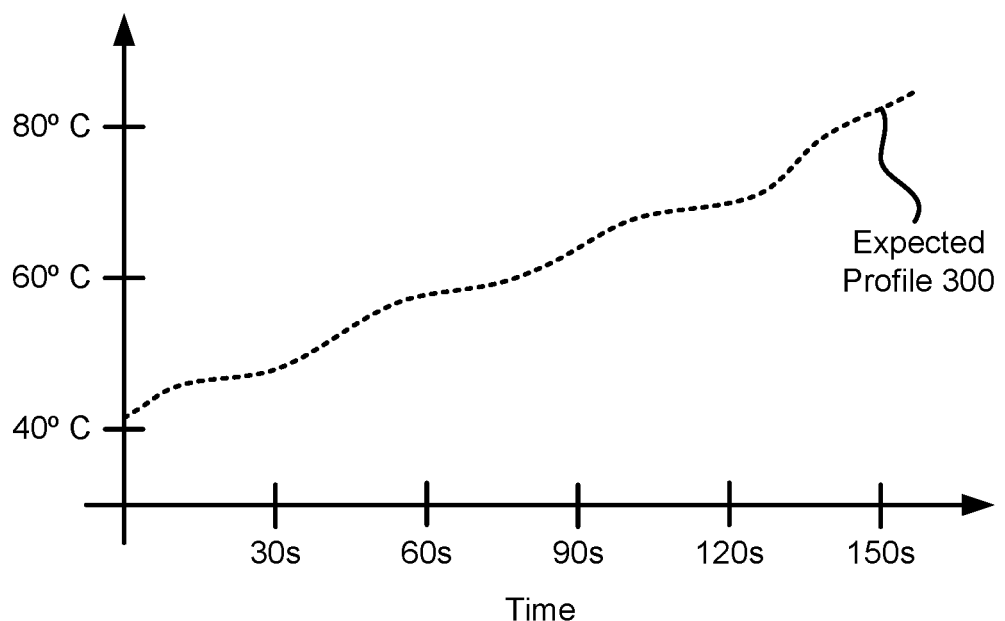
FIGS. 3A-3D show plots of temperatures of hardware components over time in accordance with an embodiment.

Turning to FIG. 3A, a first plot of a temperature of a hardware component over time (e.g., a profile, shown for 150 seconds) in accordance with an embodiment is shown. In FIG. 3A, expected profile 300 reflects the temperature of a hardware component over time during a particular thermal test and while the data processing system in which the hardware component resides is in a known, good state free of material deposited on dissipation components, gas flow control components, etc., and the dissipation components operate at known rates. As seen in FIG. 3A, when so operated the temperature of the hardware component increases over time.

Figure 3B:
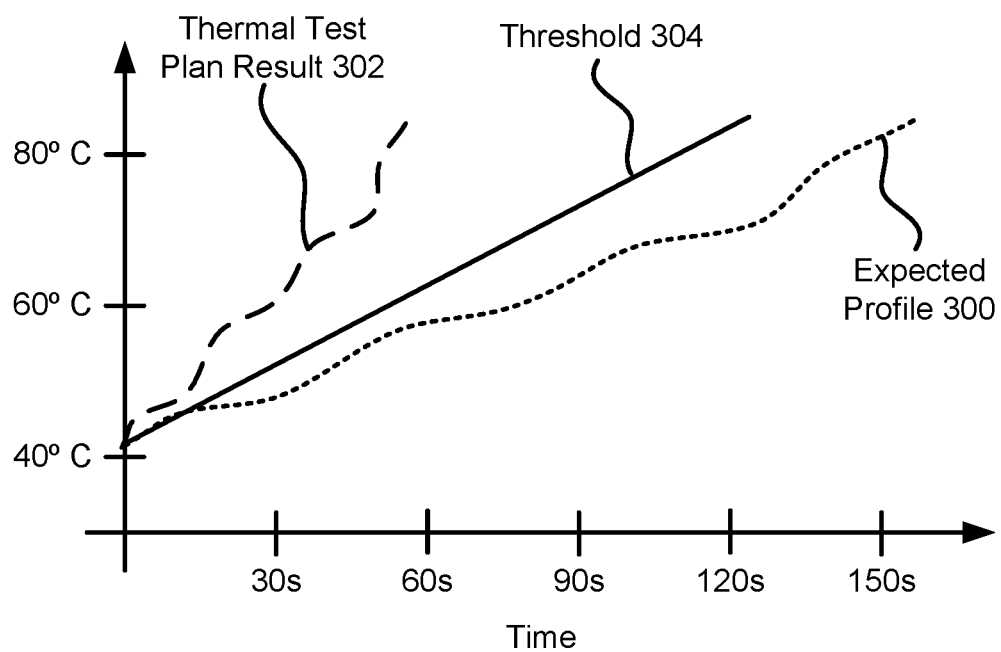

Turning to FIG. 3B, a second plot in accordance with an embodiment is shown. As seen in FIG. 3B, in addition to expected profile 300 a thermal test plan result 302 is also shown. In contrast to expected profile 300, thermal test plan result 302 shows a temperature of the hardware component during the same thermal test, but performed while some amount of material was present on the dissipation component, gas flow control components, etc.

As seen in FIG. 3B, the presence of these materials insulate the hardware component thereby causing its temperature to increase at a faster rate than seen in expected profile 300. Consequently, when the slope (e.g., a metric) of thermal test plan result 302 is compared to the slope of expected profile 300, the larger slope of thermal test plan result 302 (e.g., greatly exceeding a threshold 304) indicates that the data processing system may be subject to an undesired thermal event.

To reduce the likelihood of the undesired thermal event from occurring, the data processing system may notify a user (and/or take other action) that the hardware component (and corresponding dissipater) need to be cleaned, or that other components (e.g., fans, intakes/exhaust) should be inspected and cleaned if warranted.

Figure 3C:
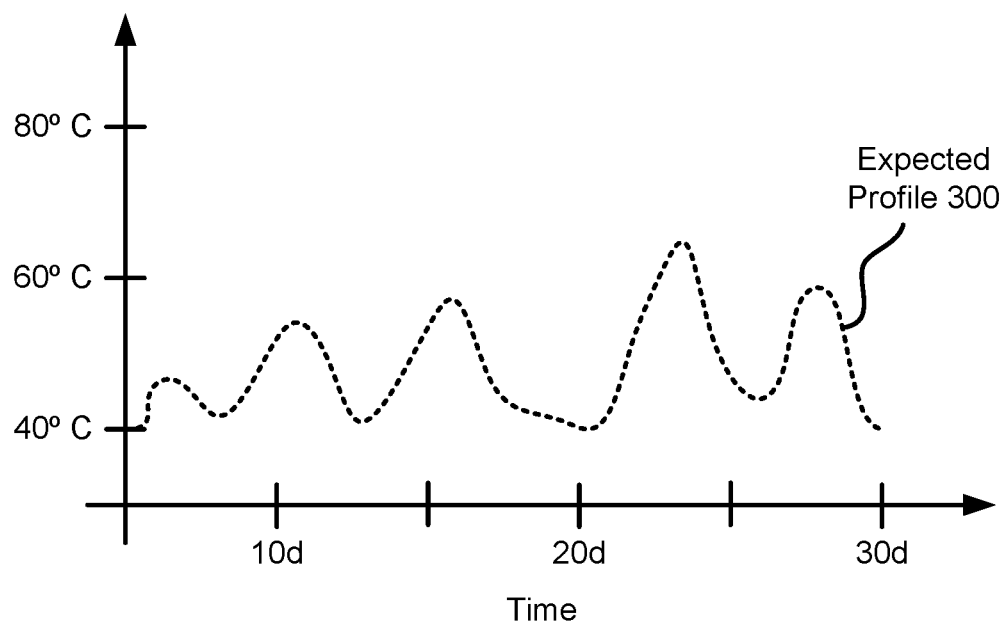

Turning to FIG. 3C, a third plot of a temperature of a hardware component over time (e.g., a profile, shown for 30 days) in accordance with an embodiment is shown. In FIG. 3B, expected profile 300 reflects the temperature of a hardware component over time while passively monitored and the heat dissipation capabilities of the data processing system being in a known good state. As seen in FIG. 3C, the temperature of the hardware component may increase and decrease over time.

Figure 3D:
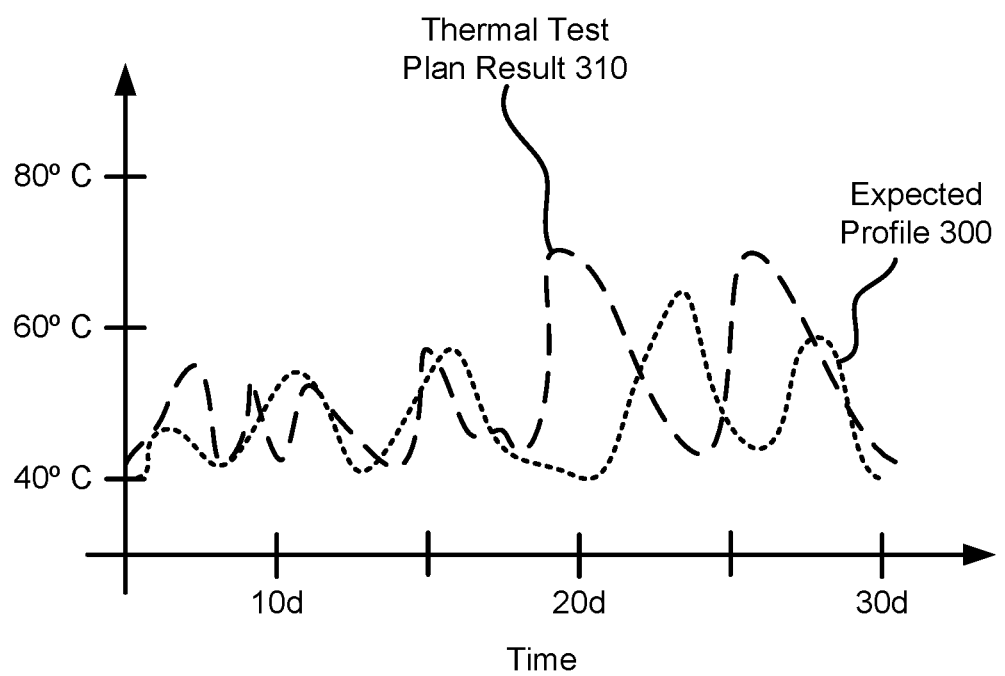

Turning to FIG. 3D, a fourth plot in accordance with an embodiment is shown. As seen in FIG. 3D, in addition to expected profile 300 a thermal test plan result 310 is also shown. In contrast to expected profile 300, thermal test plan result 310 shows a temperature of the hardware component (passively monitored) during a different period of time while some amount of material was present on the dissipation component, gas flow control components, etc.

As seen in FIG. 3D, the presence of the material insulates the hardware component thereby causing its temperature to increase at a faster rate than seen in expected profile 300, and to take longer to decrease over time. Consequently, when the average absolute slope (e.g., a metric) of thermal test plan result 310 is compared to the average absolute slope of expected profile 300, the larger absolute slope of thermal test plan result 310 indicates that the data processing system may be subject to an undesired thermal event.

Thus, through either active testing as discussed with respect to FIGS. 3A-3B or passive monitoring as discussed with respect to FIGS. 3C-3D, embodiments disclosed herein may facilitate the proactive identification in changes in heat dissipation capability, and remediation of the heat dissipation capability of a data processing system to avoid undesired thermal events.

Any of the components illustrated in FIGS. 1A-1B may be implemented with one or more computing devices. Turning to FIG. 4, a block diagram illustrating an example of a data processing system (e.g., a computing device) in accordance with an embodiment is shown. For example, system 400 may represent any of data processing systems described above performing any of the processes or methods described above. System 400 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 400 is intended to show a high level view of many components of the computer system. However, it is to be understood that additional components may be present in certain implementations and furthermore, different arrangement of the components shown may occur in other implementations. System 400 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 400 includes processor 401, memory 403, and devices 405-408 via a bus or an interconnect 410. Processor 401 may represent a single processor or multiple processors with a single processor core or multiple processor cores included therein. Processor 401 may represent one or more general-purpose processors such as a microprocessor, a central processing unit (CPU), or the like.

More particularly, processor 401 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 401 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 401, which may be a low power multi-core processor socket such as an ultra-low voltage processor, may act as a main processing unit and central hub for communication with the various components of the system. Such processor can be implemented as a system on chip (SoC). Processor 401 is configured to execute instructions for performing the operations discussed herein. System 400 may further include a graphics interface that communicates with optional graphics subsystem 404, which may include a display controller, a graphics processor, and/or a display device.

Processor 401 may communicate with memory 403, which in one embodiment can be implemented via multiple memory devices to provide for a given amount of system memory. Memory 403 may include one or more volatile storage (or memory) devices such as random access memory (RAM), dynamic RAM (DRAM), synchronous DRAM (SDRAM), static RAM (SRAM), or other types of storage devices. Memory 403 may store information including sequences of instructions that are executed by processor 401, or any other device. For example, executable code and/or data of a variety of operating systems, device drivers, firmware (e.g., input output basic system or BIOS), and/or applications can be loaded in memory 403 and executed by processor 401. An operating system can be any kind of operating systems, such as, for example, Windows® operating system from Microsoft®, Mac OS®/iOS® from Apple, Android® from Google®, Linux®, Unix®, or other real-time or embedded operating systems such as VxWorks.

System 400 may further include 10 devices such as devices (e.g., 405, 406, 407, 408) including network interface device(s) 405, optional input device(s) 406, and other optional 10 device(s) 407. Network interface device(s) 405 may include a wireless transceiver and/or a network interface card (NIC). The wireless transceiver may be a WiFi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 406 may include a mouse, a touch pad, a touch sensitive screen (which may be integrated with a display device of optional graphics subsystem 404), a pointer device such as a stylus, and/or a keyboard (e.g., physical keyboard or a virtual keyboard displayed as part of a touch sensitive screen). For example, input device(s) 406 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 407 may include an audio device. An audio device may include a speaker and/or a microphone to facilitate voice-enabled functions, such as voice recognition, voice replication, digital recording, and/or telephony functions. Other IO devices 407 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. IO device(s) 407 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 410 via a sensor hub (not shown), while other devices such as a keyboard or thermal sensor may be controlled by an embedded controller (not shown), dependent upon the specific configuration or design of system 400.

To provide for persistent storage of information such as data, applications, one or more operating systems and so forth, a mass storage (not shown) may also couple to processor 401. In various embodiments, to enable a thinner and lighter system design as well as to improve system responsiveness, this mass storage may be implemented via a solid state device (SSD). However, in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also a flash device may be coupled to processor 401, e.g., via a serial peripheral interface (SPI). This flash device may provide for non-volatile storage of system software, including a basic input/output software (BIOS) as well as other firmware of the system.

Storage device 408 may include computer-readable storage medium 409 (also known as a machine-readable storage medium or a computer-readable medium) on which is stored one or more sets of instructions or software (e.g., processing module, unit, and/or processing module/unit/logic 428) embodying any one or more of the methodologies or functions described herein. Processing module/unit/logic 428 may represent any of the components described above. Processing module/unit/logic 428 may also reside, completely or at least partially, within memory 403 and/or within processor 401 during execution thereof by system 400, memory 403 and processor 401 also constituting machine-accessible storage media. Processing module/unit/logic 428 may further be transmitted or received over a network via network interface device(s) 405.

Computer-readable storage medium 409 may also be used to store some software functionalities described above persistently. While computer-readable storage medium 409 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies disclosed herein. The term "computer-readable storage medium" shall accordingly be taken to include, but not be limited to, solid-state memories, and optical and magnetic media, or any other non-transitory machine-readable medium.

Processing module/unit/logic 428, components and other features described herein can be implemented as discrete hardware components or integrated in the functionality of hardware components such as ASICS, FPGAs, DSPs or similar devices. In addition, processing module/unit/logic 428 can be implemented as firmware or functional circuitry within hardware devices. Further, processing module/unit/logic 428 can be implemented in any combination hardware devices and software components.

Note that while system 400 is illustrated with various components of a data processing system, it is not intended to represent any particular architecture or manner of interconnecting the components; as such details are not germane to embodiments disclosed herein. It will also be appreciated that network computers, handheld computers, mobile phones, servers, and/or other data processing systems which have fewer components or perhaps more components may also be used with embodiments disclosed herein.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments disclosed herein also relate to an apparatus for performing the operations herein. Such a computer program is stored in a non-transitory computer readable medium. A non-transitory machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments disclosed herein are not described with reference to any particular programming language. It will be appreciated that a variety of programming languages may be used to implement the teachings of embodiments as described herein.

In the foregoing specification, embodiments have been described with reference to specific exemplary embodiments thereof. It will be evident that various modifications may be made thereto without departing from the broader spirit and scope of the embodiments disclosed herein as set forth in the following claims. The specification and drawings are, accordingly, to be regarded in an illustrative sense rather than a restrictive sense.

What is claimed is:

1. A computer-implemented method for managing a thermal state of a data processing system that provides computer implemented services, the method comprising:
   identifying a thermal management event for the data processing system;
   based on the identified thermal management event, initiating performance of a thermal test plan;
   while the thermal test plan is performed, monitoring thermal states of one or more thermally active components of the data processing system to obtain a thermal test plan result, the thermal test plan result indicating a rate of thermal dissipation for the one or more thermally active components;
   obtaining a thermal performance metric based on the thermal test plan result;
   making a determination that the thermal performance metric indicates that an undesirable thermal event is likely to occur, an instance of the undesirable thermal event preventing the computer implemented services from being provided, at least temporarily, by the data processing system, wherein the rate of thermal dissipation for the one or more thermally active components is used by the data processing system to determine whether entrained materials are blocking at least one air inlet or outlet of the data processing system, and the blocking of the at least one air inlet or outlet resulting in the likely occurrence of the undesirable thermal event; and
   based on the determination, performing an action set to reduce a likelihood of the undesired thermal event from occurring, the action set comprising causing one or more existing fans installed within the data processing system to generate a first gas flow to remove the entrained materials that contribute to the likely occurrence of the undesirable thermal event from within the data processing system.

2. The computer-implemented method of claim 1, wherein the thermal test plan result indicates a temperature increase rate of at least one of the one or more thermally active components.

3. The computer-implemented method of claim 2, wherein initiating the thermal test plan comprises:
   identifying a thermal generation rate specified by the thermal test plan; and
   setting an operation of the at least one of the one or more thermally active components to generate heat at the thermal generate rate.

4. The computer-implemented method of claim 3, wherein initiating the thermal test plan further comprises:

identifying a thermal dissipation rate specified by the thermal test plan; and setting an operation of a thermal dissipation component to dissipate the heat at the thermal dissipation rate.

5. The computer-implemented method of claim 4, wherein the thermal dissipation components comprise a fan of the one or more existing fans and the operation of the fan is set to generate a second gas flow that dissipates the heat, and the operation of the fan set based, at least in part, on an assumption that a dissipater for the at least one of the one or more thermally active components is substantially free of insulating material.

6. The computer-implemented method of claim 5, wherein the operation of the fan is further set, based at least in part, on an assumption that a constriction in a flow path of the second gas flow is substantially free of constricting material.

7. The computer-implemented method of claim 6, wherein the operation of the fan is set to a predetermined operating point for a period of time during the performance of the thermal test plan.

8. The computer-implemented method of claim 2, wherein the thermal performance metric is obtained, at least in part, by quantifying a difference between the temperature increase rate of the at least one of the one or more thermally active components and an expected temperature increase rate of the at least one of the one or more thermally active components.

9. The computer-implemented method of claim 2, wherein initiating the thermal test plan comprises:
   initiating passive temperature monitoring to obtain a first result; and
   initiating passive thermal load generation monitoring to obtain a second result.

10. The computer-implemented method of claim 9, wherein the thermal performance metric is obtained, at least in part, by quantifying a difference between:
    a temperature increase rate of the at least one of the one or more thermally active components obtained via the passive temperature monitoring; and
    a temperature increase rate of the at least one of the one or more thermally active components obtained via previously performed passive temperature monitoring.

11. The computer-implemented method of claim 1, wherein the action set further comprises displaying an alert to a user of the data processing system, the alert indicating that a cleaning procedure should be performed, and the cleaning procedure removing material from an interior of the data processing system that may reduce the rate at which heat may be dissipated from the at least one of the one or more thermally active components.

12. The computer-implemented method of claim 1, wherein the rate of thermal dissipation for the one or more thermally active components is based on a gas flow rate measured by one or more flow meters disposed within the data processing system.

13. A non-transitory machine-readable medium having instructions stored therein, which when executed by a processor, cause the processor to perform operations for managing a thermal state of a data processing system that provides computer implemented services, the operations comprising:
    identifying a thermal management event for the data processing system;
    based on the identified thermal management event, initiating performance of a thermal test plan;
    while the thermal test plan is performed, monitoring thermal states of one or more thermally active components of the data processing system to obtain a thermal test plan result, the thermal test plan result indicating a rate of thermal dissipation for the one or more thermally active components;
    obtaining a thermal performance metric based on the thermal test plan result;
    making a determination that the thermal performance metric indicates that an undesirable thermal event is likely to occur, an instance of the undesirable thermal event preventing the computer implemented services from being provided, at least temporarily, by the data processing system, wherein the rate of thermal dissipation for the one or more thermally active components is used by the data processing system to determine whether entrained materials are blocking at least one air inlet or outlet of the data processing system, and the blocking of the at least one air inlet or outlet resulting in the likely occurrence of the undesirable thermal event; and
    based on the determination, performing an action set to reduce a likelihood of the undesired thermal event from occurring, the action set comprising causing one or more existing fans installed within the data processing system to generate a first gas flow to remove the entrained materials that contribute to the likely occurrence of the undesirable thermal event from within the data processing system.

14. The non-transitory machine-readable medium of claim 13, wherein the thermal test plan result indicates a temperature increase rate of at least one of the one or more thermally active components.

15. The non-transitory machine-readable medium of claim 14, wherein initiating the thermal test plan comprises:
    identifying a thermal generation rate specified by the thermal test plan; and
    setting an operation of the at least one of the one or more thermally active components to generate heat at the thermal generate rate.

16. The non-transitory machine-readable medium of claim 15, wherein initiating the thermal test plan further comprises:
    identifying a thermal dissipation rate specified by the thermal test plan; and
    setting an operation of a thermal dissipation component to dissipate the heat at the thermal dissipation rate.

17. A data processing system, comprising:
    a processor; and
    a memory coupled to the processor to store instructions, which when executed by the processor, cause the processor to perform operations for managing a thermal state of the data processing system when providing computer implemented services, the operations comprising:
        identifying a thermal management event for the data processing system;
        based on the identified thermal management event, initiating performance of a thermal test plan;
        while the thermal test plan is performed, monitoring thermal states of one or more thermally active components of the data processing system to obtain a thermal test plan result, the thermal test plan result indicating a rate of thermal dissipation for the one or more thermally active components;
        obtaining a thermal performance metric based on the thermal test plan result;

making a determination that the thermal performance metric indicates that an undesirable thermal event is likely to occur, an instance of the undesirable thermal event preventing the computer implemented services from being provided, at least temporarily, by the data processing system, wherein the rate of thermal dissipation for the one or more thermally active components is used by the data processing system to determine whether entrained materials are blocking at least one air inlet or outlet of the data processing system, and the blocking of the at least one air inlet or outlet resulting in the likely occurrence of the undesirable thermal event; and based on the determination, performing an action set to reduce a likelihood of the undesired thermal event from occurring, the action set comprising causing one or more existing fans installed within the data processing system to generate a first gas flow to remove the entrained materials that contribute to the likely occurrence of the undesirable thermal event from within the data processing system.

18. The data processing system of claim 17, wherein the thermal test plan result indicates a temperature increase rate of at least one of the one or more thermally active components.

19. The data processing system of claim 18, wherein initiating the thermal test plan comprises:

identifying a thermal generation rate specified by the thermal test plan; and setting an operation of the at least one of the one or more thermally active components to generate heat at the thermal generate rate.

\* \* \* \* \*